(12) United States Patent
Chang et al.

(10) Patent No.: US 10,678,148 B2
(45) Date of Patent: Jun. 9, 2020

(54) LITHOGRAPHY SYSTEM AND LITHOGRAPHY METHOD

(71) Applicant: Taiwan Semiconductor Manufacturing Co., Ltd., Hsinchu (TW)

(72) Inventors: Kai-Chieh Chang, Changhua (TW); Tsung-Hsun Lee, Kaohsiung (TW); Ching-Juinn Huang, Changhua (TW); Li-Jui Chen, Hsinchu (TW); Po-Chung Cheng, Zhongpu Shiang (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/279,237

(22) Filed: Feb. 19, 2019

(65) Prior Publication Data

US 2020/0041914 A1    Feb. 6, 2020

Related U.S. Application Data

(60) Provisional application No. 62/712,382, filed on Jul. 31, 2018.

(51) Int. Cl.
*G03B 27/52* (2006.01)
*G03F 7/20* (2006.01)

(52) U.S. Cl.
CPC ........ *G03F 7/7085* (2013.01); *G03F 7/70491* (2013.01); *G03F 7/70533* (2013.01); *G03F 7/70725* (2013.01); *G03F 7/70875* (2013.01)

(58) Field of Classification Search
CPC .. G03F 7/2004; G03F 7/2002; G03F 7/70616; G03F 7/70016–7/70033; G03F 7/70491; G03F 7/70516; G03F 7/70525; G03F 7/70533; G03F 7/70558; G03F 7/70591; G03F 7/707; G03F 7/70716;
(Continued)

(56) References Cited

U.S. PATENT DOCUMENTS 4,585,342 A * 4/1986 Lin ................ G01J 1/4257
356/121
5,363,171 A * 11/1994 Mack ............. G03F 7/70558
355/53
(Continued)

*Primary Examiner* — Christina A Riddle
(74) *Attorney, Agent, or Firm* — Birch, Stewart, Kolasch & Birch, LLP

(57) ABSTRACT

A lithography system is provided and includes a light source device configured to emit a processing light beam onto the semiconductor wafer, to generate a penetrating light beam and a reflected light beam. The lithography system further includes a detecting module having a first detector and a second detector. The first detector is configured to receive the penetrating light beam to generate first power data, and the second detector is configured to receive the reflected light beam to generate second power data. The lithography system also includes a monitoring device configured to calculate absorbed power data of the semiconductor wafer according to the first power data, the second power data and reference power data of a reference light beam and configured to compensate for a pattern formed on the semiconductor wafer resulting from the processing light beam according to the absorbed power data and reference information.

20 Claims, 10 Drawing Sheets

(58) Field of Classification Search
CPC ............ G03F 7/70725; G03F 7/70783; G03F 7/7085; G03F 7/70866; G03F 7/70875
USPC ............... 355/30, 52, 53, 55, 67–74, 77; 250/492.1, 492.2, 492.22, 493.1; 430/14, 430/22, 30, 269, 311, 394
See application file for complete search history.

(56) References Cited

U.S. PATENT DOCUMENTS

| | | | |
|---|---|---|---|
| 5,650,840 A * | 7/1997 | Taniguchi | G03F 9/70 250/548 |
| 5,796,467 A * | 8/1998 | Suzuki | G03F 7/70241 355/53 |
| 5,834,785 A * | 11/1998 | Coon | G03F 7/70558 250/492.2 |
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2001/0043321 A1 * | 11/2001 | Nishi | G03F 7/70058 355/67 |
| 2003/0102440 A1 * | 6/2003 | Sohn | G03F 7/70533 250/491.1 |

* cited by examiner

LITHOGRAPHY SYSTEM AND LITHOGRAPHY METHOD

PRIORITY CLAIM AND CROSS-REFERENCE

This application claims the benefit of U.S. Provisional Application No. 62/712,382, filed on Jul. 31, 2018, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL employs scanners using light in the extreme ultraviolet (EUV) region, having a wavelength of about 1-100 nm. One type of EUV light source is laser-produced plasma (LPP). LPP technology produces EUV light by focusing a high-power laser beam onto small fuel target droplets to form highly ionized plasma that emits EUV radiation with a peak of maximum emission at 13.5 nm. The EUV light is then collected by a collector and reflected by optics towards a lithography exposure object, e.g., a wafer.

Although existing methods and devices for lithography process have been adequate for their intended purposes, they have not been entirely satisfactory in all respects. Consequently, it would be desirable to provide a solution for decreasing the heating effects on the wafer during lithography process.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
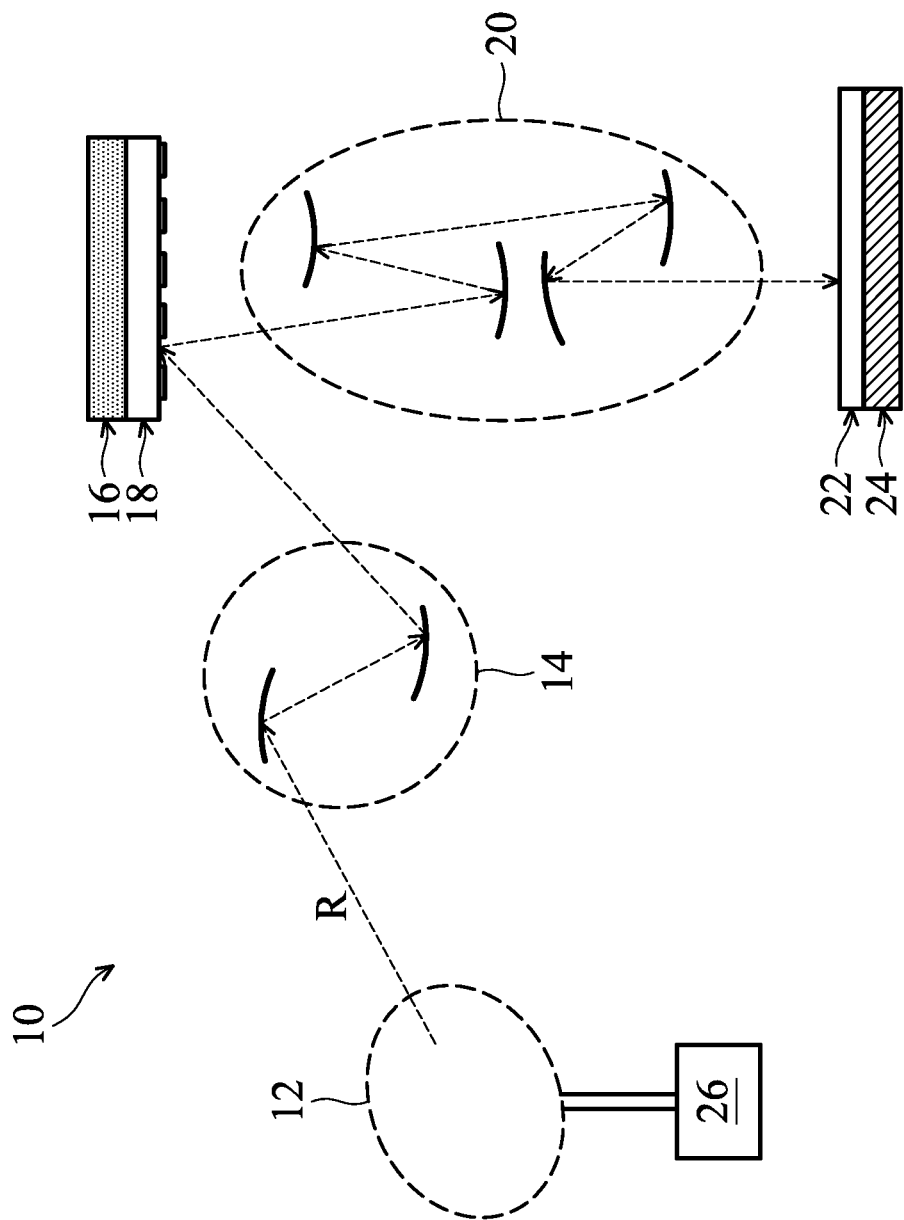
FIG. 1 is a schematic and diagrammatic view of a lithography system, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The present disclosure is generally related to lithography systems and lithography methods. More particularly, it is related to lithography system and methods for effectively detecting the power which is absorbed by the semiconductor wafer during the lithography process, so that a pattern formed on the semiconductor wafer can be compensated for immediately, and the wafer throughput of a lithography process using this method can be improved. One challenge in existing lithography systems is low efficiency and the fact that they take too much time. An object of the present disclosure is to minimize the time required for the process to detect the power which is absorbed by the semiconductor wafer, thereby improving the wafer throughput of the lithography process. Another challenge is that the pattern to be formed on the semiconductor wafer may be deformed by the thermal energy. Accordingly, another object of the present disclosure is to compensate for the deformation by the lithography system.

FIG. 1 is a schematic and diagrammatic view of a lithography system 10, in accordance with some embodiments. The lithography system 10 may also be generically referred to as a scanner that is operable to perform lithographic exposure processes with a respective radiation source and exposure mode.

The lithography system 10 includes a radiation source module 12, an illuminator 14, a mask stage 16, a reticle 18, a projection optics module (or projection optics box (POB)) 20 and a wafer stage 24, in accordance with some embodiments. The elements of the lithography system 10 can be added to or omitted, and the invention should not be limited by the embodiment.

The radiation source module 12 is configured to generate radians having a wavelength ranging between about 1 nm and about 100 nm. In one particular example, the radiation source module 12 generates a EUV light with a wavelength centered at about 13.5 nm. Accordingly, the radiation source module 12 is also referred to as a EUV light source. However, it should be appreciated that the radiation source module 12 should not be limited to emitting EUV light. The radiation source module 12 can be utilized to perform any high-intensity photon emission from excited target material.

In various embodiments, the illuminator 14 includes various optical modules, such as a single lens or a lens system having multiple lenses (zone plates) or alternatively reflective optics (for EUV lithography system), such as a single mirror or a mirror system having multiple mirrors in order to direct light from the radiation source module 12 onto a mask stage 16, particularly to a reticle 18 secured on the mask stage 16. In the present embodiment where the radiation source module 12 generates light in the EUV wavelength range, reflective optics is employed.

The mask stage 16 is configured to secure the reticle 18. In some embodiments, the mask stage 16 includes an electrostatic chuck (e-chuck) to secure the reticle 18. This is because the gas molecules absorb EUV light and the lithography system for the EUV lithography patterning is maintained in a vacuum environment to avoid EUV intensity loss. In the present disclosure, the terms mask, photomask, and reticle are used interchangeably.

In the present embodiment, the reticle 18 is a reflective reticle. One exemplary structure of the reticle 18 includes a substrate with a suitable material, such as a low thermal expansion material (LTEM) or fused quartz. In various examples, the LTEM includes $TiO_2$ doped $SiO_2$, or other suitable materials with low thermal expansion. The reticle 18 includes a reflective multilayer deposited on the substrate.

The reflective multilayer includes a plurality of film pairs, such as molybdenum-silicon (Mo/Si) film pairs (e.g., a layer of molybdenum above or below a layer of silicon in each film pair). Alternatively, the reflective multilayer may include molybdenum-beryllium (Mo/Be) film pairs, or other suitable materials that are configurable to highly reflect the EUV light. The reticle 18 may further include a capping layer, such as ruthenium (Ru), disposed on the reflective multilayer for protection. The reticle 18 further includes an absorption layer, such as a tantalum boron nitride (TaBN) layer, deposited over the reflective multilayer. The absorption layer is patterned to define a layer of an integrated circuit (IC). Alternatively, another reflective layer may be deposited over the reflective multilayer and is patterned to define a layer of an integrated circuit, thereby forming a EUV phase shift reticle.

The projection optics module (or projection optics box (POB)) 20 is configured for imaging the pattern of the reticle 18 on to a semiconductor wafer 22 secured on a wafer stage 24 of the lithography system 10. In some embodiments, the POB 20 has refractive optics (such as for a UV lithography system) or alternatively reflective optics (such as for a EUV lithography system) in various embodiments. The light directed from the reticle 18, carrying the image of the pattern defined on the reticle, is collected by the POB 20. The illuminator 14 and the POB 20 are collectively referred to as an optical module of the lithography system 10.

In the present embodiment, the semiconductor wafer 22 may be made of silicon or another semiconductor material. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, the semiconductor wafer 22 is coated with a resist layer sensitive to the EUV light in the present embodiment. Various components including those described above are integrated together and are operable to perform lithography exposing processes.

The lithography system 10 may further include other modules or be integrated with (or be coupled with) other modules. In the present embodiment, the lithography system 10 includes a gas supply module 26 designed to provide hydrogen gas to the radiation source module 12. The hydrogen gas helps reduce contamination in the radiation source module 12.

Figure 2:
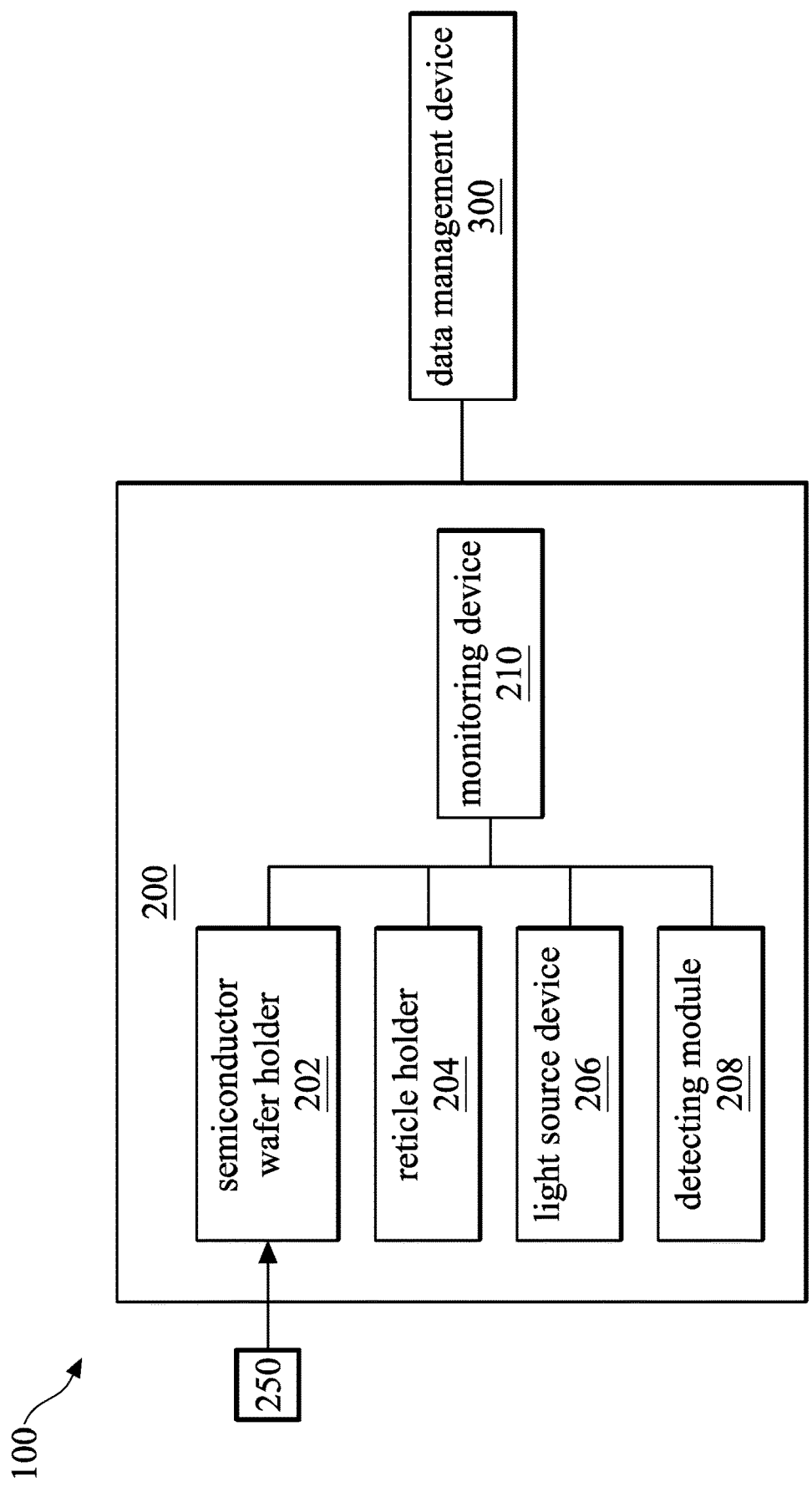
FIG. 2 shows a block diagram of a lithography system according to some embodiments of the present disclosure.

Please refer to FIG. 2, which shows a block diagram of a lithography system 100 according to some embodiments of the present disclosure. As shown in FIG. 2, the lithography system 100 may include a lithography apparatus 200 and a data management device 300. In this embodiment, the lithography apparatus 200 is similar to the lithography system 10 in FIG. 1, and one or more semiconductor wafers 250, similar to the semiconductor wafer 22 in FIG. 1, are transported into the lithography apparatus 200 to perform the lithography process. In some embodiments, a plurality of layers is formed on a semiconductor substrate (such as the semiconductor wafer 22) during the lithography process.

In this embodiment, the lithography apparatus 200 can include a semiconductor wafer holder 202, a reticle holder 204 and a light source device 206. The structure of the semiconductor wafer holder 202 is similar to the structure of the wafer stage 24 in FIG. 1, and the semiconductor wafer holder 202 is configured to secure a semiconductor wafer. The structure of the reticle holder 204 is similar to the structure of the mask stage 16 in FIG. 1, and the reticle holder 204 is configured to secure a reticle. The light source device 206 can includes elements similar to the radiation source module 12, the illuminator 14, and the projection optics module 20 in FIG. 1. The light source device 206 is configured to emit a light beam onto to image a pattern of a reticle to the semiconductor wafer during the lithography process. In this embodiment, the light source device 206 includes a EUV light source configured to emit a EUV light beam onto the semiconductor wafer, but it is not limited thereto. For example, in some embodiments, the light source device 206 can further include a high-brightness light source, such as an ultraviolet (UV) source or a deep ultraviolet (DUV) source.

However, when the EUV light beam is emitted on the semiconductor wafer during the lithography process, some of power of the EUV light beam may be transformed into thermal energy which is absorbed by the semiconductor wafer, resulting in defects on the semiconductor wafer. For example, the pattern formed on the semiconductor wafer may be deformed because of thermal expansion of the semiconductor wafer. For preventing the defects on the semiconductor wafer, a detecting module and a monitoring device can be provided to compensate for the pattern formed on the semiconductor wafer.

As shown in FIG. 2, the lithography apparatus 200 further includes a detecting module 208 and a monitoring device 210. The detecting module 208 is configured to detect the variation of energy of the EUV light beam, so as to provide data to the monitoring device 210. In addition, the monitoring device 210 is configured to calculate the power (the thermal energy) which is absorbed by the semiconductor wafer (also referred to as the absorbed power data) according to data from the detecting module 208.

In this embodiment, the monitoring device 210 can include a controller, and the controller may be a computer system. In one example, the computer system includes a processor and a system memory component. In accordance with embodiments of the present disclosure, the computer system performs specific operations via a processor executing one or more sequences of one or more instructions contained in a system memory component.

The processor may include a digital signal processor (DSP), a microcontroller (MCU), and a central processing unit (CPU). The system memory component may include a random access memory (RAM) or another dynamic storage device or read only memory (ROM) or other static storage devices, for storing data and/or instructions to be executed by the processor.

In this embodiment, the lithography system 100 can further include the data management device 300. The data management device 300 can be a server which is directly connected to the lithography apparatus 200 or is wirelessly connected to the lithography apparatus 200. The data management device 300 also has a system memory component, such as the random access memory (RAM) or hard drives, and the data management device 300 can store reference information in the system memory component. In some embodiments, the reference information is related to structures (films) formed on the semiconductor wafer, absorption coefficients (such as light absorption coefficients) of the structures and thermal expansion coefficients of the structures.

The reference information is provided to the monitoring device 210, and then the monitoring device 210 can compensate for the pattern formed on the semiconductor wafer according to the absorbed power data and reference information. The details will be described as follows.

It should be noted that, in some embodiments, the data management device 300 can be integrated into the monitoring device 210. That is, the data management device 300 can be omitted in some embodiments.

Figure 3:
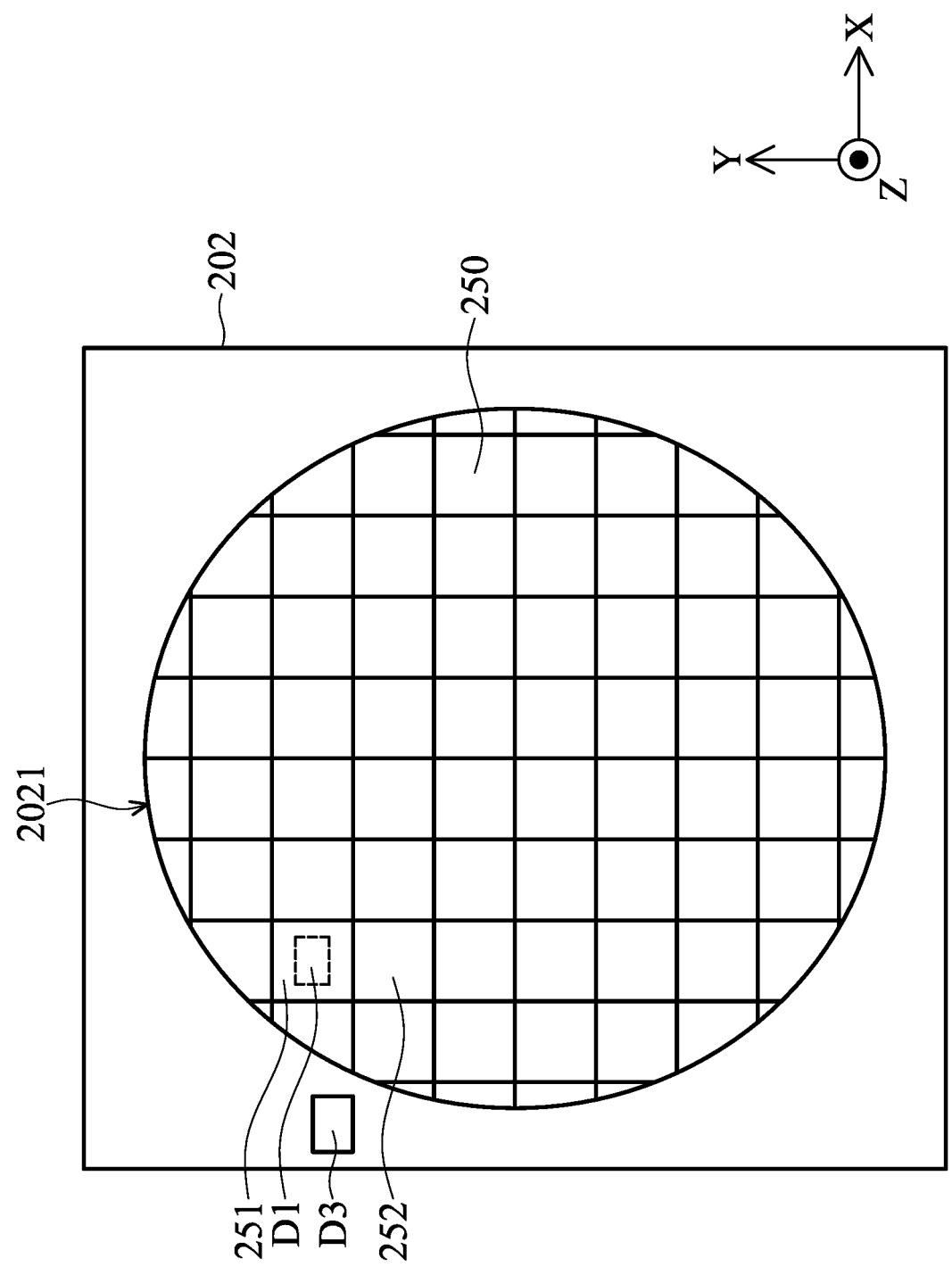
FIG. 3 is a top view of the semiconductor wafer holder holding a semiconductor wafer according to some embodiments of the present disclosure.
Figure 4:
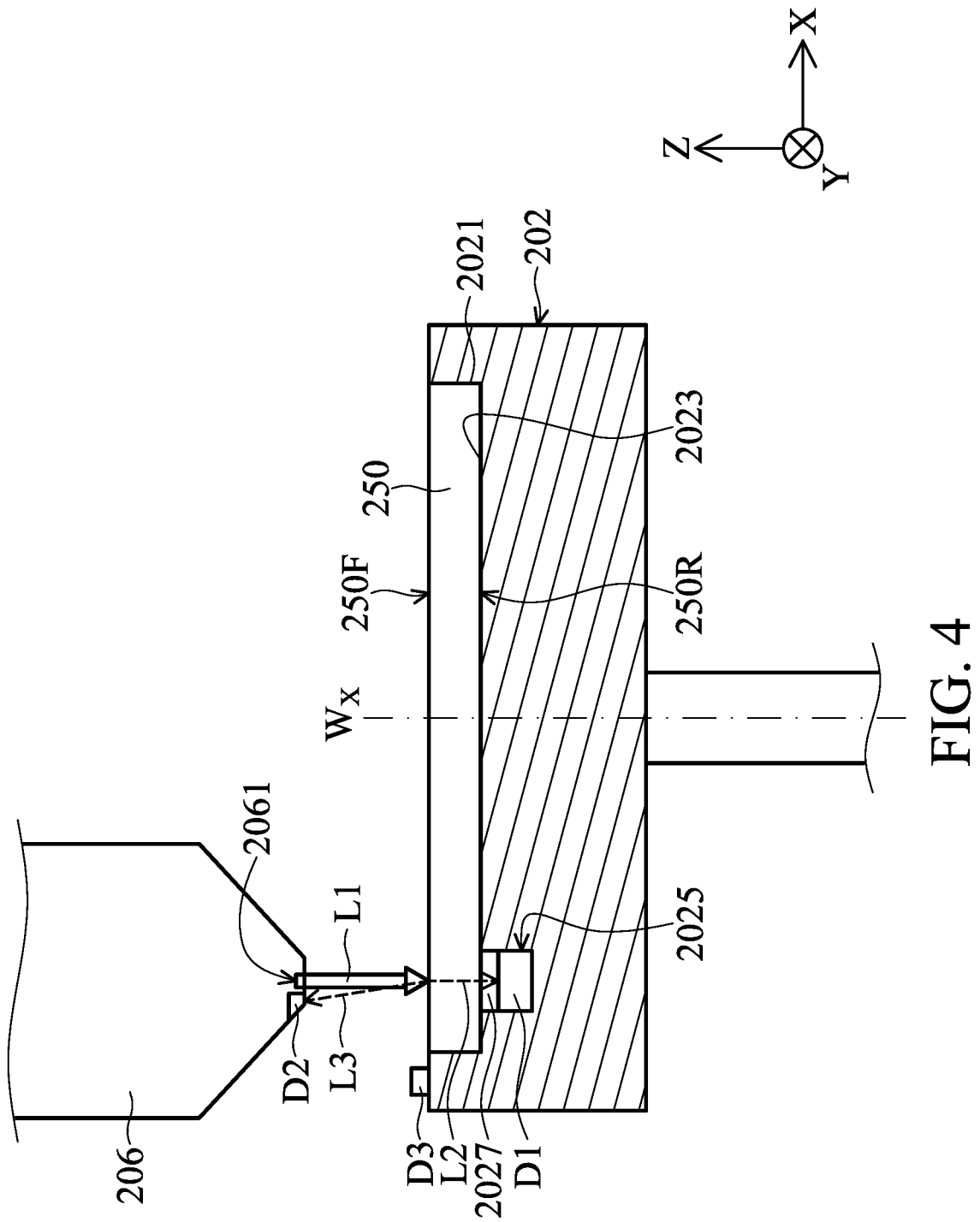
FIG. 4 is a side view of the semiconductor wafer holder and the light source device according to some embodiments of the present disclosure.

Please refer to FIG. 3 and FIG. 4. FIG. 3 is a top view of the semiconductor wafer holder 202 holding a semiconductor wafer 250 according to some embodiments of the present disclosure. FIG. 4 is a side view of the semiconductor wafer holder 202 and the light source device 206 according to some embodiments of the present disclosure. As shown in FIG. 3 and FIG. 4, the semiconductor wafer holder 202 is configured to hold the semiconductor wafer 250. For example, in this embodiment, the semiconductor wafer holder 202 has a groove 2021 for receiving the semiconductor wafer 250.

In addition, the semiconductor wafer 250 has a front side 250F and a rear side 250R, and the rear side 250R is in contact with a contacting surface 2023 of the semiconductor wafer holder 202. In some embodiments, the semiconductor wafer holder 202 can be an electrostatic chuck (e-chuck) for securing the semiconductor wafer 250. It should be noted that the structure of the semiconductor wafer holder 202 is not limited to this embodiment. For example, the semiconductor wafer 250 can be secured by the semiconductor wafer holder 202 in other manners.

As shown in FIG. 4, the light source device 206 is disposed above the semiconductor wafer holder 202 and is configured to emit a light beam (a processing light beam) onto the front side 250F of the semiconductor wafer 250 so as to form patterns on the semiconductor wafer 250. Furthermore, as shown in FIG. 3 and FIG. 4, the detecting module 208 can include a first detector D1, a second detector D2 and a third detector D3. In this embodiment, the first detector D1, the second detector D2 and the third detector D3 are photodiodes, but they are not limited thereto.

The first detector D1 is disposed inside the semiconductor wafer holder 202. For example, the semiconductor wafer holder 202 has an accommodating space 2025 for accommodating the first detector D1. In addition, a transparent member 2027 is disposed in the accommodating space 2025 and is located between the first detector D1 and the semiconductor wafer 250. The transparent member 2027 can be glass, and the transparent member 2027 may or may not be in contact with the semiconductor wafer 250. It should be noted that the number of detectors of the detecting module 208 and the material of the transparent member 2027 is not limited to this embodiment.

Furthermore, as shown in FIG. 4, the light source device 206 has a light emitting hole 2061, and the second detector D2 is disposed near the light emitting hole. That is, the second detector D2 and the light source device 206 are disposed on the same side of the semiconductor wafer holder 202. In addition, the first detector D1 and the light source device 206 are disposed on opposite sides of the contacting surface 2023 of the semiconductor wafer holder 202.

As shown in FIG. 3 and FIG. 4, the third detector D3 is disposed on the semiconductor wafer holder 202 and near the groove 2021 of the semiconductor wafer holder 202. That is, as shown in FIG. 4, the third detector D3 is located between the first detector D1 and the second detector D2 along a longitudinal axis Wx (the Z-axis) which is perpendicular to the semiconductor wafer 250.

As shown in FIG. 3 and FIG. 4, the light source device 206 is configured to emit a light beam L1 (the processing light beam) through the light emitting hole 2061 onto the semiconductor wafer 250 during a lithography process. For example, the light beam L1 is projected onto a first processing area 251 in FIG. 3 to form a pattern on the first processing area 251. It should be noted that the pattern of the first processing area 251 is not compensated for and is affected by the power of the light beam L1 (such as the thermal energy), and therefore the pattern of the first processing area 251 may be a deformed pattern which is not preferred.

As shown in FIG. 4, a penetrating light beam L2 and a reflected light beam L3 are generated after the light beam L1 is projected on the semiconductor wafer 250. In this embodiment, the first detector D1 is configured to receive the penetrating light beam L2 and then generate first power data. The second detector D2 is configured to receive the reflected light beam L3, and then generate second power data.

In addition, the light source device 206 can also emit another light beam (a reference light beam) to the third detector D3. Therefore, the third detector D3 is configured to receive the reference light beam and then generate reference power data. It should be noted that the power of the processing light beam is substantially equal to the power of the reference light beam.

Figure 5:
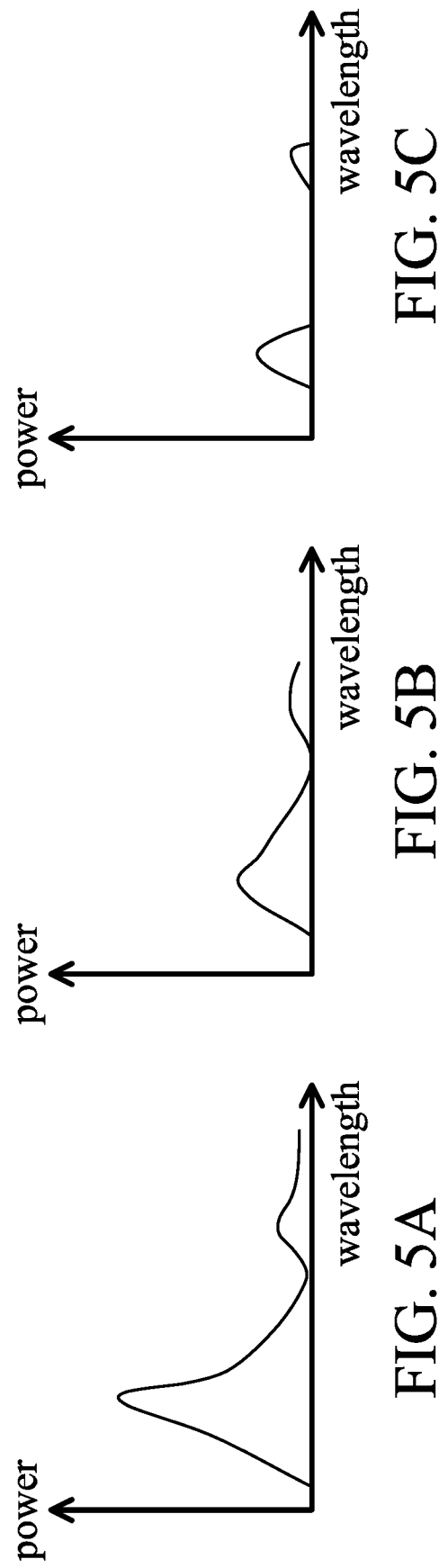
FIG. 5A is a diagram illustrating the spectrum of the reference light beam according to some embodiments of the present disclosure.
FIG. 5B is a diagram illustrating the spectrum of the penetrating light beam according to some embodiments of the present disclosure.
FIG. 5C is a diagram illustrating the spectrum of the reflected light beam according to some embodiments of the present disclosure.

Please refer to FIG. 5A to FIG. 5C. FIG. 5A is a diagram illustrating a spectrum of the reference light beam according to some embodiments of the present disclosure. FIG. 5B is a diagram illustrating a spectrum of the penetrating light beam L2 according to some embodiments of the present disclosure. FIG. 5C is a diagram illustrating a spectrum of the reflected light beam L3 according to some embodiments of the present disclosure. In this embodiment, the reference power data can be illustrated as FIG. 5A, the first power data can be illustrated as FIG. 5B, and the second power data can be illustrated as FIG. 5C.

In this embodiment, the first power data, the second power data and the second power data are sent to the monitoring device 210, and the monitoring device 210 is configured to calculate absorbed power data of the semiconductor wafer 250 according to the following equation (1):

$$Ptotal = Pt + Pr + Pa \quad (1)$$

wherein Ptotal represents the reference power data, Pt represents the first power data, Pr represents the second power data, and Pa represents the absorbed power data.

In this embodiment, the absorbed power data indicates the energy which is absorbed by the semiconductor wafer 250. After the monitoring device 210 calculates the absorbed power data according to the equation (1), the monitoring device 210 sends the absorbed power data to the data management device 300. Then, the data management device 300 generates a control signal according to the reference information and the absorbed power data. For example, the reference information is related to the film structure on the first processing area 251 of the semiconductor wafer 250 which receiving the light beam L1, such as the film stature, light absorption coefficients and the thermal expansion coefficients.

Next, the monitoring device 210 receives the control signal and then the monitoring device 210 is configured to compensate for a pattern formed on another processing area, such as a second processing area 252 in FIG. 3. For example, in FIG. 4, the monitoring device 210 can control the light source device 206 and the semiconductor wafer holder 202 to move or rotate according to the control signal when forming the pattern on the second processing area 252. As a result, the monitoring device 210 is configured to control an angle formed between the light beam L1 and the semiconductor wafer 250 and the position of the semiconductor wafer 250 relative to the light source device 206, so as to compensate for the pattern formed on the second processing area 252.

Figure 6:
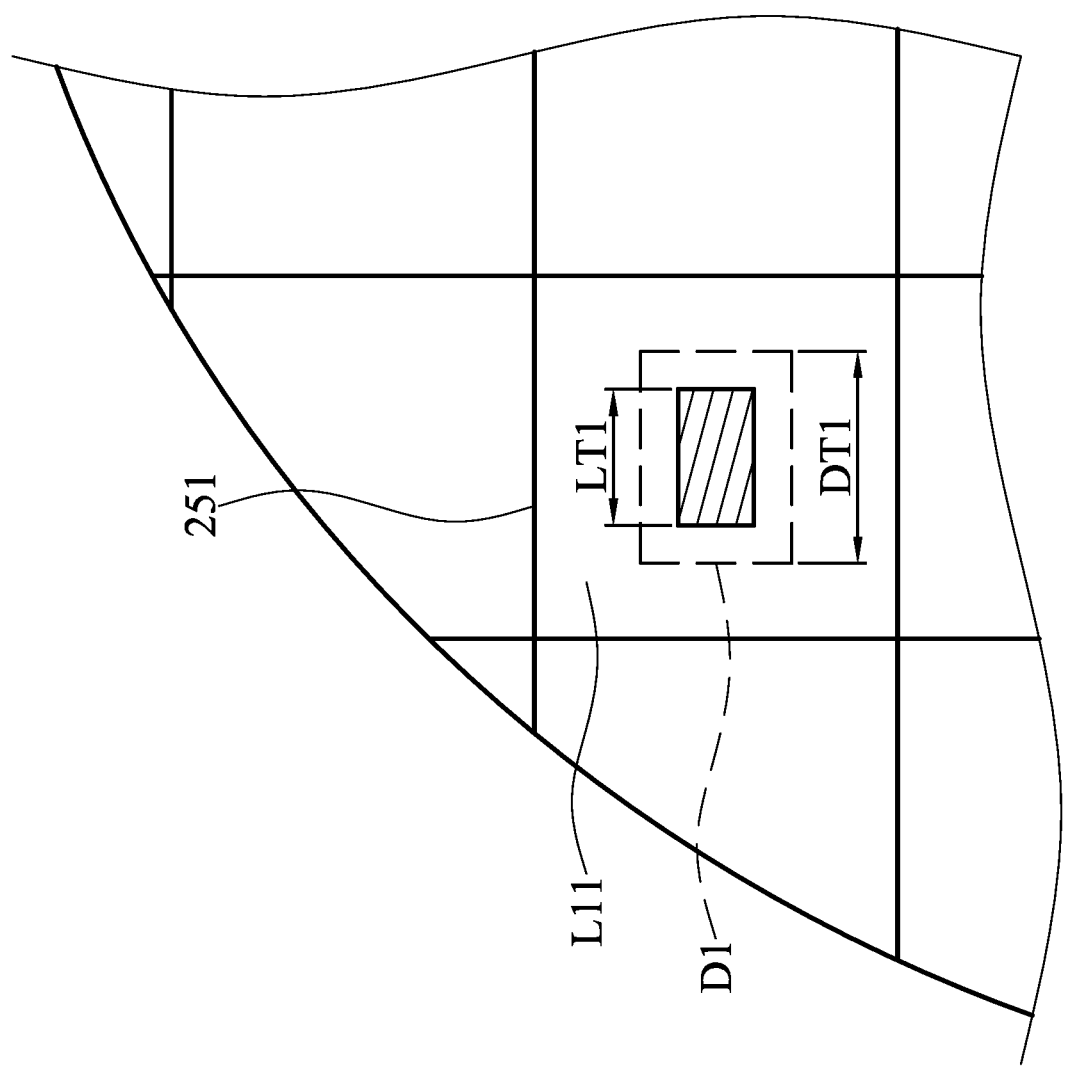
FIG. 6 shows an enlarged diagram of the first processing area of the semiconductor wafer according to some embodiments of the present disclosure.

Please refer to FIG. 6, which shows an enlarged diagram of the first processing area 251 of the semiconductor wafer 250 according to some embodiments of the present disclosure. As shown in FIG. 6, a projection L11 of the light beam L1 is on the first processing area 251. In this embodiment, a shape of the projection L11 includes a long strip structure, and the shape of the projection L11 of the light beam L1 (the processing light beam) has a longitudinal length LT1. It should be noted that the shape of the projection L11 is not limited to this embodiment.

In addition, in this embodiment, a shape of first detector D1 also includes a long strip structure. That is, the shape of the first detector D1 matches the shape of projection L11 of the processing light beam on the semiconductor wafer 250. It should be noted that the shape of first detector D1 has a side length DT1, and the side length DT1 is greater than the longitudinal length LT1.

Based on this structural design of this embodiment, it can be ensured that the penetrating light beam L2 is completely received by the first detector D1, and therefore the accuracy of detecting result of the first detector D1 (i.e. the first power data) can be increased.

It should be noted that the shapes of the projection L11 and the first detector D1 are not limited to this embodiment. For example, in some embodiments, the projection L11 can have an arc structure, the first detector D1 has a square structure, and the area of the first detector D1 is greater than the area of the projection L11.

Figure 7:
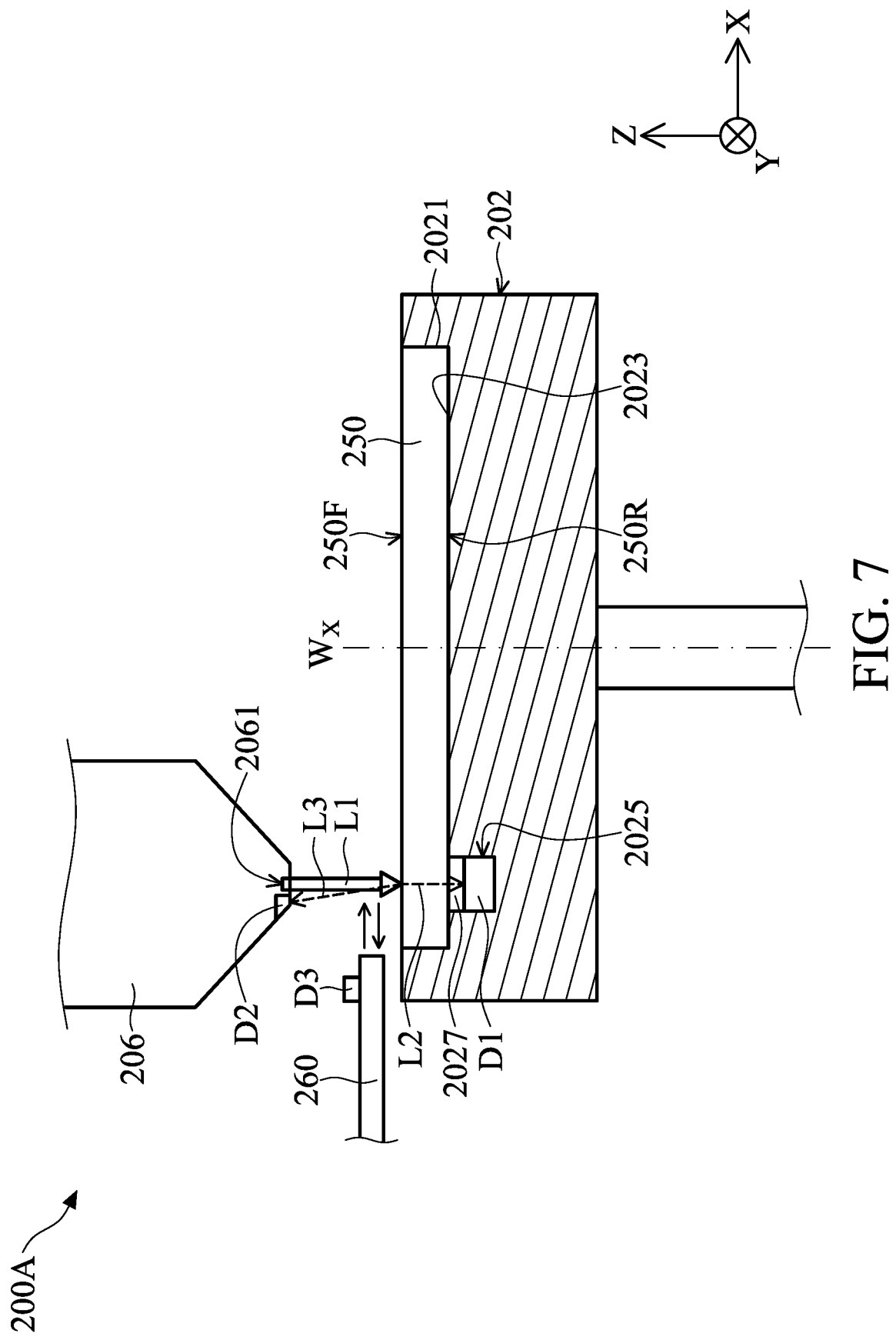
FIG. 7 is a side view of the semiconductor wafer holder and the light source device of a lithography apparatus according to another embodiment of the present disclosure.

Please refer to FIG. 7, which is a side view of the semiconductor wafer holder 202 and the light source device 206 of a lithography apparatus 200A according to another embodiment of the present disclosure. In this embodiment, the lithography apparatus 200A can further include a robotic arm 260 which is controlled by the monitoring device 210, and the third detector D3 is disposed on the robotic arm 260. As shown in FIG. 7, the robotic arm 260 can be controlled to move rightward or leftward so that the third detector D3 can receive the light beam from the light source device 206.

Based on this structural design of this embodiment, the light source device 206 does not need to move to the edge of the semiconductor wafer holder 202 (such as the third detector D3 being located on the edge of the semiconductor wafer holder 202 in FIG. 4) before emitting the light beam L1 to the semiconductor wafer 250, so as to decrease the processing time of lithography process.

Figure 8:
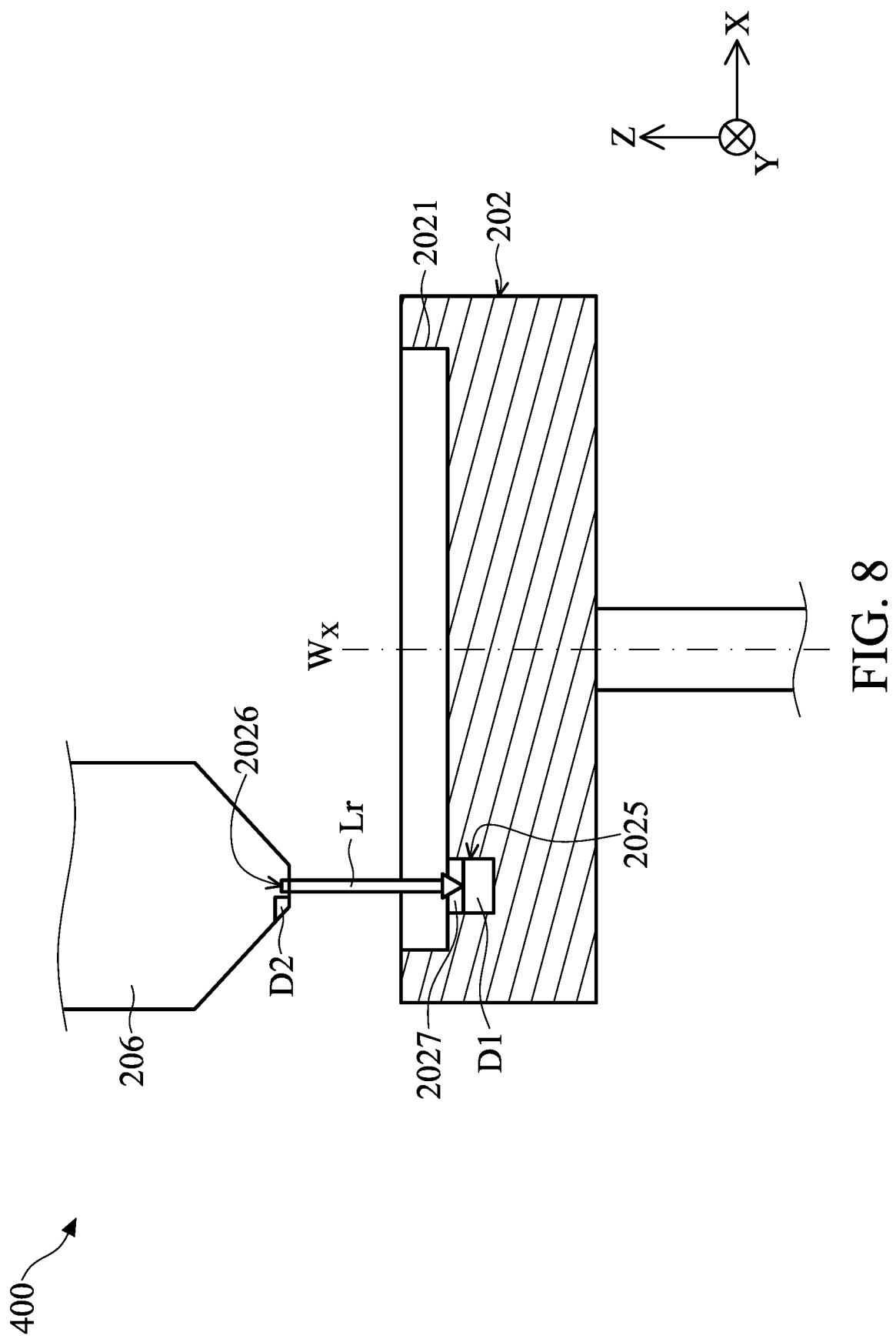
FIG. 8 is a side view of the semiconductor wafer holder and the light source device of a lithography apparatus according to another embodiment of the present disclosure.

Please refer to FIG. 8, which is a side view of the semiconductor wafer holder 202 and the light source device 206 of a lithography apparatus 400 according to another embodiment of the present disclosure. In this embodiment, the lithography apparatus 400 only includes the first detector D1 and the second detector D2 without the third detector D3.

As shown in FIG. 8, the semiconductor wafer holder 202 does not secure any semiconductor wafer, and the light source device 206 is configured to emit a reference light beam Lr to the first detector D1 before the lithography process is performed. Therefore, the first detector D1 is configured to receive the reference light beam Lr initially to generate the reference power data.

Figure 9:
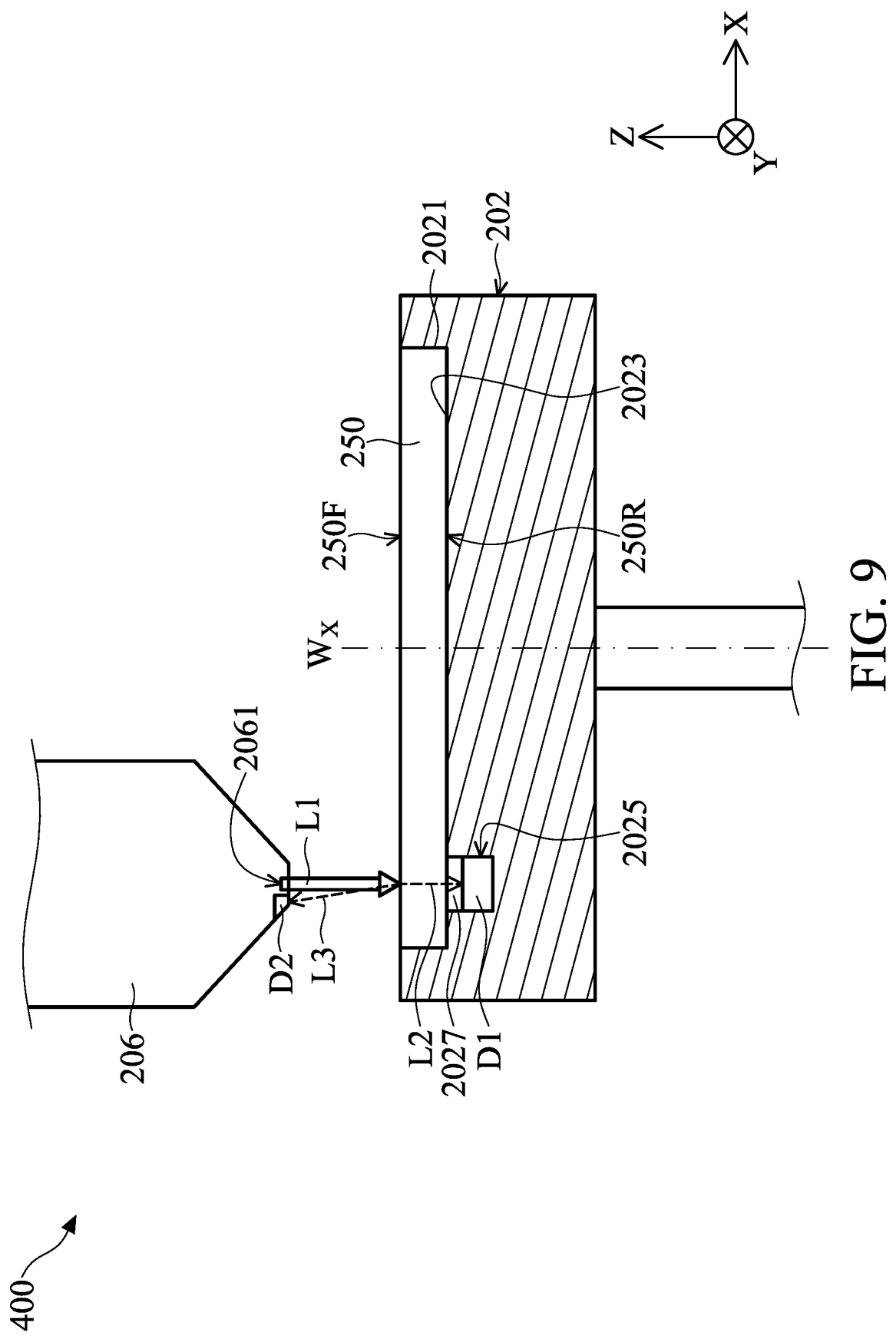
FIG. 9 is a side view of the semiconductor wafer holder securing the semiconductor wafer according to some embodiments of the present disclosure.

Next, please refer to FIG. 9, which is a side view of the semiconductor wafer holder 202 securing the semiconductor wafer 250 according to some embodiments of the present disclosure. The semiconductor wafer 250 can be transported by a robotic arm (not shown in this figure) to the semiconductor wafer holder 202, and then the semiconductor wafer 250 is secured in the groove 2021 of the semiconductor wafer holder 202.

After that, the light source device 206 is configured to emit the light beam L1 onto the semiconductor wafer 250 to perform a lithography process. For example, the light beam L1 is projected onto the first processing area 251 in FIG. 3 to form a pattern on the first processing area 251. Then, the first detector D1 is configured to receive the penetrating light beam L2 and generate the first power data. The second detector D2 is configured to receive the reflected light beam L3, and then generate the second power data.

Similar to the lithography apparatus 200, the monitoring device 210 is configured to calculate the absorbed power data of the semiconductor wafer 250 according to the first power data, the second power data and reference power data, and then the monitoring device 210 is configured to compensate for a pattern formed on another processing area, such as a second processing area 252 in FIG. 3, according to the absorbed power data and reference information. Therefore, all of the other processing areas can be immediately compensated for by the monitoring device 210 during the lithography process.

Figure 10:
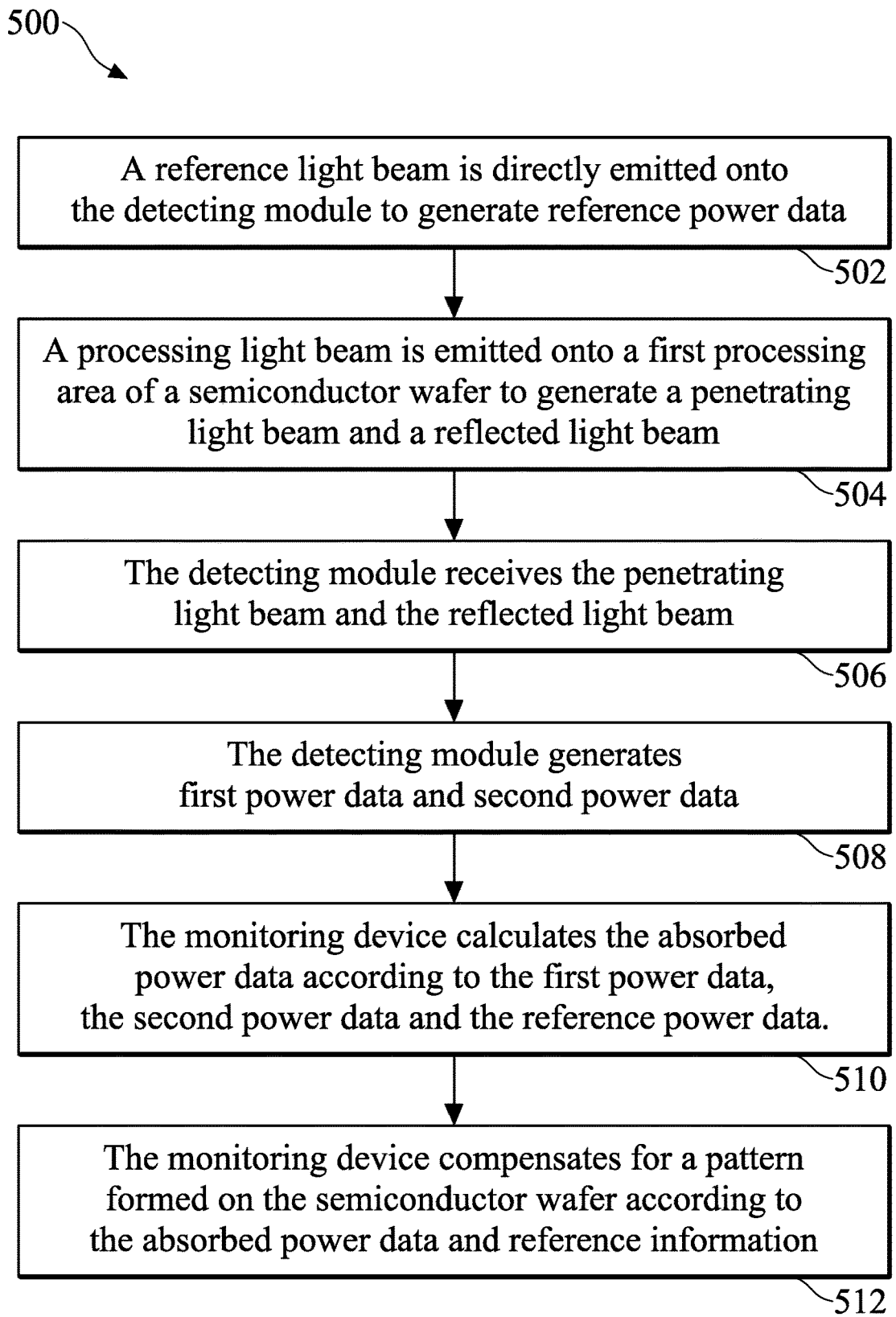
FIG. 10 is a flowchart of a lithography method according to some embodiments of the present disclosure.

FIG. 10 is a flowchart of a lithography method 500 according to some embodiments of the present disclosure. The method 500 includes operation 502, in which a reference light beam is directly emitted onto the detecting module to generate the reference power data before emitting the processing light beam onto the semiconductor wafer. For example, as shown in FIG. 4, the light source device 206 can emit the reference light beam to the third detector D3 before emitting the light beam L1 to the semiconductor wafer 250, and then the third detector D3 generates the reference power data.

The method 500 also includes operation 504 in which a processing light beam is emitted onto a processing area of a semiconductor wafer to generate a penetrating light beam and a reflected light beam. For example, as shown in FIG. 3 and FIG. 4, the light source device 206 emits the light beam L1 to the first processing area 251 of the semiconductor wafer 250.

The method 500 also includes operation 506 in which the detecting module 208 receives the penetrating light beam and the reflected light beam. As shown in FIG. 4, the first detector D1 of the detecting module 208 receives the penetrating light beam L2, and the second detector D2 of the detecting module 208 receives the reflected light beam L3.

In addition, the method 500 also includes operation 508 in which the detecting module 208 generates the first power data and the second power data. For example, the first detector D1 generates the first power data, and the second detector D2 generates the second power data.

In operation 510, the monitoring device 210 calculates the absorbed power data of the semiconductor wafer 250 according to the first power data, the second power data and the reference power data. For example, the monitoring device 210 calculates the absorbed power data according to the equation (1).

The method 500 also includes operation 512 in which the monitoring device 210 compensates for a pattern formed on the semiconductor wafer according to the absorbed power data and reference information. For example, in the embodiment of the lithography apparatus 200, the monitoring device 210 sends the absorbed power data to the data management device 300, and the data management device 300 generates a control signal according to the reference information and the absorbed power data.

Then, the monitoring device 210 receives the control signal and controls the light source device 206 to emit another processing light beam onto a second processing area 252 of the semiconductor wafer 250 adjacent to the first processing area 251, to form a pattern on the second processing area 252. Furthermore, the monitoring device 210 also controls the angle between the light beam L1 and the semiconductor wafer 250 and the position of the semiconductor wafer 250 relative to the light source device 206 according to the absorbed power data and the reference information, so as to compensate for the pattern formed on the second processing area 252.

After the pattern on the second processing area 252 is finished, operation 512 can be repeatedly performed for the other processing areas, so as to form a desired pattern on each processing area.

It should be noted that some operations of method 500 can be performed together, or some operations can be omitted in some embodiments. For example, operation 502 can be performed between operation 508 and operation 510 in some embodiments.

Embodiments of the present disclosure can provide lithography systems and methods for compensating for the patterns formed on the semiconductor wafer in a EUV lithography process. Based on the design of the lithography system of the present disclosure, the detecting module 208 can detect the power which is absorbed by the semiconductor wafer when the light source device 206 images the pattern on the first processing area 251. That is, the lithography system can obtain the absorbed power data by only imaging one processing area and does not need to complete the lithography process for all of processing areas (dies) to obtain the absorbed power data. Therefore, the time required for detecting power absorbed by the semiconductor wafer by the lithography systems of the present disclosure can be greatly reduced. For example, the time of process for detecting the absorbed power data can be reduced from 3 hours to 5 minutes using the lithography systems.

In addition, the absorbed power data can be more accurately obtained by the lithography system of the present disclosure, so that the compensated pattern formed on the semiconductor wafer can be more similar to the pattern of the reticle, so as to minimize the effect of the thermal expansion of the semiconductor wafer. That is, the defects on the semiconductor wafer can be quickly compensated by the lithography systems during the lithography process.

According to some embodiments, a lithography system is provided. The lithography system includes a light source device configured to emit a processing light beam onto the semiconductor wafer during a lithography process, so as to generate a penetrating light beam and a reflected light beam. The lithography system further includes a detecting module.

The detecting module includes a first detector and a second detector. The first detector is configured to receive the penetrating light beam to generate first power data, and the second detector is configured to receive the reflected light beam to generate second power data. The lithography system also includes a monitoring device configured to calculate absorbed power data of the semiconductor wafer according to the first power data, the second power data and reference power data of a reference light beam. The monitoring device is configured to compensate for a pattern formed on the semiconductor wafer resulting from the processing light beam according to the absorbed power data and reference information.

According to some embodiments, another lithography system is provided. The lithography system includes a light source device configured to emit a processing light beam onto the semiconductor wafer during a lithography process, so as to generate a penetrating light beam and a reflected light beam. The lithography system further includes a detecting module. The detecting module includes a first detector, a second detector and a third detector. The first detector is configured to receive the penetrating light beam to generate first power data. The second detector is configured to receive the reflected light beam to generate second power data. The third detector is configured to receive a reference light beam to generate reference power data. The lithography system also includes monitoring device, configured to calculate an absorbed power of the semiconductor wafer according to the first power data, the second power data and the reference power data, wherein the monitoring device is configured to compensate for a pattern, resulting from the processing light beam, on the semiconductor wafer according to the absorbed power data and reference information.

According to some embodiments, a lithography method for a semiconductor wafer is provided. The method includes emitting a processing light beam onto a first processing area of a semiconductor wafer to generate a penetrating light beam and a reflected light beam. In addition, the method includes receiving, by a detecting module, the penetrating light beam and the reflected light beam. The method further includes generating, by the detecting module, first power data and second power data based on the received penetrating light beam and the received reflected light beam. The method further includes calculating, by a monitoring device, absorbed power data of the semiconductor wafer according to the first power data, the second power data and reference power data of a reference light beam. The method further includes compensating, by the monitoring device, for a pattern formed on the semiconductor wafer resulting from the processing light beam according to the absorbed power data and reference information.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A lithography system, comprising:
   a light source device, configured to emit a processing light beam onto a semiconductor wafer during a lithography process, so as to generate a penetrating light beam and a reflected light beam;
   a detecting module, comprising:
      a first detector, configured to receive the penetrating light beam to generate first power data; and
      a second detector, configured to receive the reflected light beam to generate second power data; and
   a monitoring device, configured to calculate absorbed power data of the semiconductor wafer according to the first power data, the second power data and reference power data of a reference light beam, wherein the monitoring device is configured to compensate for a pattern formed on the semiconductor wafer resulting from the processing light beam according to the absorbed power data and reference information;
   wherein the light source device has a light emitting hole, the light emitting hole is disposed at an end portion of the light source device, and the second detector is disposed at the end portion of the light source device and is adjacent to the light emitting hole, and
   wherein the first detector is aligned with a first processing area of the semiconductor wafer which initially receives the processing light beam.

2. The lithography system as claimed in claim 1, wherein the first detector is configured to receive the reference light beam initially to generate the reference power data.

3. The lithography system as claimed in claim 1, wherein the monitoring device controls an angle formed between the processing light beam and the semiconductor wafer during the lithography process according to the absorbed power data and reference information.

4. The lithography system as claimed in claim 3, wherein the reference information is related to structures formed on the semiconductor wafer and thermal expansion coefficients of the structures.

5. The lithography system as claimed in claim 1, further comprising a semiconductor wafer holder configured to hold the semiconductor wafer, wherein the first detector and the light source device are disposed on opposite sides of a contacting surface of the semiconductor wafer holder.

6. The lithography system as claimed in claim 1, further comprising a semiconductor wafer holder configured to hold the semiconductor wafer, wherein the second detector and the light source device are disposed on the same side of the semiconductor wafer holder.

7. The lithography system of claim 1, wherein a shape of the first detector matches a shape of a projection of the processing light beam on the semiconductor wafer.

8. The lithography system of claim 7, wherein the shape of the first detector and the shape of the projection of the processing light beam on the semiconductor wafer include a long strip structure.

9. The lithography system of claim 8, wherein the shape of the first detector has a side length, the shape of the projection of the processing light beam has a longitudinal length, and the side length is greater than the longitudinal length.

10. The lithography system of claim 1, further comprising a semiconductor wafer holder configured to hold the semiconductor wafer, and the first detector is disposed inside the semiconductor wafer holder.

11. The lithography system of claim 10, wherein the semiconductor wafer holder has an accommodating space for accommodating the first detector, and a transparent member is disposed between the first detector and the light source device.

12. The lithography system as claimed in claim 1, wherein the light emitting hole and the second detector are at a same level from the semiconductor wafer.

13. A lithography system, comprising:
   a light source device, configured to emit a processing light beam onto a semiconductor wafer during a lithography process, so as to generate a penetrating light beam and a reflected light beam;
   a detecting module, comprising:
      a first detector, configured to receive the penetrating light beam to generate first power data;
      a second detector, configured to receive the reflected light beam to generate second power data; and
      a third detector, configured to receive a reference light beam to generate reference power data; and
   a monitoring device, configured to calculate absorbed power of the semiconductor wafer according to the first power data, the second power data and the reference power data, wherein the monitoring device is configured to compensate for a pattern, resulting from the processing light beam, on the semiconductor wafer according to the absorbed power data and reference information;
   wherein the light source device has a light emitting hole, the light emitting hole is disposed at an end portion of the light source device, and the second detector is disposed at the end portion of the light source device and is adjacent to the light emitting hole, and
   wherein the first detector is aligned with a first processing area of the semiconductor wafer which initially receives the processing light beam.

14. The lithography system of claim 13, wherein the lithography system further includes a semiconductor wafer holder configured to hold the semiconductor wafer, and the third detector is disposed on the semiconductor wafer holder and on a peripheral of a groove of the semiconductor wafer holder.

15. The lithography system of claim 13, wherein the third detector is located between the first detector and the second detector along a longitudinal axis which is perpendicular to the semiconductor wafer.

16. The lithography system of claim 13, wherein a power of the processing light beam is substantially equal to a power of the reference light beam.

17. The lithography system as claimed in claim 13, wherein a shape of the first detector matches a shape of a projection of the processing light beam on the semiconductor wafer.

18. A lithography method, comprising:
   emitting a processing light beam, by a light emitting device through a light emitting hole of the light emitting device, onto a first processing area of a semiconductor wafer to generate a penetrating light beam and a reflected light beam, wherein the light emitting hole is disposed at an end portion of the light source device;
   receiving, by a detecting module, the penetrating light beam and the reflected light beam, wherein a detector of the detecting module for receiving the reflected light beam is disposed at the end portion of the light source device and is adjacent to the light emitting hole, and another detector of the detecting module for receiving the penetrating light beam is aligned with the first processing area of the semiconductor wafer which initially receives the processing light beam;
   generating, by the detecting module, first power data and second power data based on the received penetrating light beam and the received reflected light beam;
   calculating, by a monitoring device, absorbed power data of the semiconductor wafer according to the first power data, the second power data and reference power data of a reference light beam; and
   compensating, by the monitoring device, for a pattern formed on the semiconductor wafer resulting from the processing light beam according to the absorbed power data and reference information.

19. The lithography method as claimed in claim 18, further comprising:
   emitting the reference light beam directly onto the detecting module to generate the reference power data before emitting the processing light beam onto the semiconductor wafer.

20. The lithography method as claimed in claim 18, wherein the step of compensating for the pattern further comprises:
   emitting another processing light beam onto a second processing area of the semiconductor wafer adjacent to the first processing area, to form a pattern on the second area according to the absorbed power data and the reference information.

* * * * *